United States Patent
Ishii et al.

(10) Patent No.: US 10,679,886 B2
(45) Date of Patent: Jun. 9, 2020

(54) WORKPIECE TREATING METHOD, SEMICONDUCTOR DEVICE, PROCESS FOR MANUFACTURING THE SAME, AND TEMPORARY FIXING COMPOSITION FOR SHEAR PEELING

(71) Applicant: JSR CORPORATION, Tokyo (JP)

(72) Inventors: Hiroyuki Ishii, Tokyo (JP); Hitoshi Katou, Tokyo (JP); Hiroki Ishikawa, Tokyo (JP); Noriko Kitahama, Tokyo (JP); Hirofumi Sasaki, Tokyo (JP); Hikaru Mizuno, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 16/183,754

(22) Filed: Nov. 8, 2018

(65) Prior Publication Data
US 2019/0157128 A1    May 23, 2019

(30) Foreign Application Priority Data

Nov. 17, 2017  (JP) ................................. 2017-221740
Jul. 13, 2018  (JP) ................................. 2018-133230

(51) Int. Cl.
| H01L 21/683 | (2006.01) |
| H01L 21/48  | (2006.01) |
| C09J 171/12 | (2006.01) |
| C09J 171/00 | (2006.01) |

(52) U.S. Cl.
CPC ........ *H01L 21/6835* (2013.01); *C09J 171/00* (2013.01); *C09J 171/12* (2013.01); *H01L 21/4853* (2013.01); *C08G 2650/56* (2013.01); *H01L 2221/68372* (2013.01); *H01L 2221/68386* (2013.01)

(58) Field of Classification Search
CPC ........................ H01L 21/6835; H01L 21/4853
See application file for complete search history.

(56) References Cited

U.S. PATENT DOCUMENTS

| 8,889,524 B2 * | 11/2014 | Takahashi ............... H01L 21/02 438/455 |
| 2008/0173970 A1 | 7/2008 | Pillalamarri |
| 2008/0200011 A1 | 8/2008 | Pillalamarri et al. |
| 2009/0117707 A1 * | 5/2009 | Shimomura ...... H01L 21/76254 438/458 |
| 2010/0206479 A1 | 8/2010 | Pillalamarri et al. |

FOREIGN PATENT DOCUMENTS

JP         2010506406        2/2010

* cited by examiner

*Primary Examiner* — Seahvosh Nikmanesh
(74) *Attorney, Agent, or Firm* — JCIPRNET

(57) ABSTRACT

A workpiece treating method includes a step (1) of forming a stack including a support, a temporary fixing material and a workpiece wherein the material includes a layer containing a polymer (A) in a range of not less than 50 mass %, the polymer (A) including a structural unit represented by the formula (A1), and the workpiece is held on the material; a step (2) of processing the workpiece and/or transporting the stack; and a step (3) of applying a shear force to the material to thereby separate the workpiece from the support.

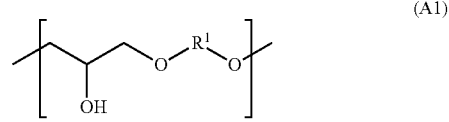

(A1)

$R^1$ is a divalent organic group including at least one aromatic ring, each of two oxygen atoms bonded to $R^1$ in (A1) is bonded to the aromatic ring, and, when $R^1$ includes two or more aromatic rings, each of the two oxygen atoms is bonded to any one of the aromatic rings.

8 Claims, No Drawings

WORKPIECE TREATING METHOD, SEMICONDUCTOR DEVICE, PROCESS FOR MANUFACTURING THE SAME, AND TEMPORARY FIXING COMPOSITION FOR SHEAR PEELING

CROSS-REFERENCE TO RELATED APPLICATION

This application claims the priority benefits of Japanese patent application no. 2017-221740, filed on Nov. 17, 2017, and Japanese patent application no. 2018-133230, filed on Jul. 13, 2018. The entirety of each of the above-mentioned patent applications is hereby incorporated by reference herein and made a part of this specification.

BACKGROUND OF THE INVENTION

Field of the Invention

The present disclosure relates to a workpiece treating method in which a workpiece such as a semiconductor wafer is processed while the workpiece has been joined to a support such as a glass substrate through a temporary fixing material, a semiconductor device and a process for manufacturing the same, and a temporary fixing composition for shear peeling.

Description of the Related Art

Methods have been proposed in which a workpiece such as a semiconductor wafer is processed by, for example, thinning and photofabrication while the workpiece has been joined to a support such as a glass substrate through a temporary fixing material. Such a temporary fixing material is required to be able to temporarily fix the workpiece on the support during the processing treatment and allow the support and the workpiece to be separated easily from each other by, for example, a shearing treatment after the processing treatment.

JP-A-2010-506406 (Patent Literature 1) discloses a wafer joining (separating) method in which a first substrate and a second substrate are joined to each other through a joining composition layer formed from a composition including a cycloolefin resin, a tackifier, and the like dissolved or dispersed in a solvent, to provide a stack, and thereafter the first substrate and the second substrate are subsequently separated from each other by a shearing treatment while being exposed to a temperature sufficient for softening the composition layer.

SUMMARY OF THE INVENTION

For example, a temporary fixing material may be exposed to a high-temperature environment in photofabrication such as formation of through-holes, bumps, and redistribution, stacking of chips, including electrical connection of chips by melt-flowing of a plating, and the like, and therefore a temporary fixing material is required to have heat resistance.

On the other hand, a temporary fixing material is required to have an ability to temporarily hold a workpiece on a support during a processing treatment and an ability to shear-peel the workpiece by melting or the like through a heating treatment in separation of the workpiece from the support after completion of the processing treatment.

For example, it is considered with respect to the joining composition layer in Patent Literature 1 that adhesion is complemented by a tackifier such as rosin because, while heat resistance is ensured by a heat resistant resin such as a cycloolefin resin, shear force resistance (adhesion) in thinning or the like of a wafer cannot be sufficiently ensured only by the heat resistant resin. In this case, however, the tackifier is low in heat resistance, and therefore may be decomposed or altered and deteriorated in adhesion under a high-temperature environment, resulting in insufficient shear force resistance in thinning or the like of a wafer.

Accordingly, a temporary fixing material for use in a method for separating a workpiece from a support by a shearing treatment is required to simultaneously have an ability to temporarily hold a workpiece even in a processing treatment after exposure to a high-temperature environment and an ability to shear-peel the workpiece.

An objective of the present disclosure is to provide a workpiece treating method by use of a temporary fixing material that can simultaneously have an ability to temporarily hold a workpiece even in a processing treatment after exposure to a high-temperature environment and an ability to shear-peel the workpiece, a semiconductor device manufacturing process and a semiconductor device, and a temporary fixing composition for shear peeling.

The present inventors carried out extensive studies directed to achieving the above objective. As a result, the present inventors have found that the object can be attained by a workpiece treating method having the configurations described below. The present disclosure has been thus completed. That is, example aspects of the present disclosure reside in [1] to [10] described below.

[1] A workpiece treating method including a step (1) of forming a stack including a support, a temporary fixing material and a workpiece wherein the temporary fixing material includes a layer containing a polymer (A) in a range of not less than 50 mass %, the polymer (A) including a structural unit represented by the following formula (A1), and the workpiece is held on the temporary fixing material; a step (2) of processing the workpiece and/or transporting the stack; and a step (3) of applying a shear force to the temporary fixing material to thereby separate the workpiece from the support.

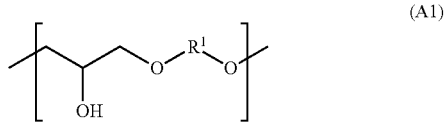

In the formula (A1), $R^1$ is a divalent organic group including at least one aromatic ring, each of two oxygen atoms bonded to $R^1$ in the formula (A1) is bonded to the aromatic ring, and, when $R^1$ includes two or more aromatic rings, each of the two oxygen atoms is bonded to any one of the aromatic rings.

[2] The workpiece treating method according to [1], wherein $R^1$ in the formula (A1) is a divalent organic group represented by the following formula (a).

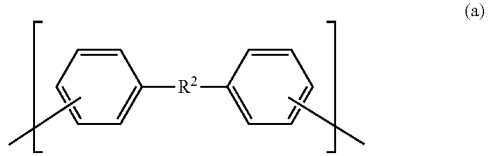

In the formula (a), $R^2$ is a single bond or an alkanediyl group, and each of two benzene rings may independently have a substituent.

[3] The workpiece treating method according to [1] or [2], wherein the polymer (A) has a hydroxyl value of 100 to 240 mgKOH/g.

[4] The workpiece treating method according to any of [1] to [3], wherein the polymer (A) has a weight average molecular weight of 5,000 to 70,000, measured by gel permeation chromatography (GPC) relative to polystyrenes.

[5] The workpiece treating method according to any of [1] to [4], wherein the step (1) includes forming a workpiece having at least a wiring layer, on the temporary fixing material.

[6] The workpiece treating method according to [5], wherein the processing in the step (2) includes arranging at least one selected from semiconductor wafers and semiconductor chips onto the wiring layer.

[7] The workpiece treating method according to any of [1] to [6], wherein the temporary fixing material is heated before and/or during the application of the shear force in the step (3).

[8] A semiconductor device manufacturing process including manufacturing a semiconductor device by processing a workpiece using the treating method described in any of [11] to [7].

[9] A semiconductor device obtained by the manufacturing process described in [8].

[10] A temporary fixing composition for shear peeling, including a polymer (A) including a structural unit represented by the formula (A1), and a solvent, wherein a proportion of a content of the polymer (A) is not less than 50 mass % of a solid content.

According to the present disclosure, a workpiece treating method by use of a temporary fixing material that can simultaneously have an ability to temporarily hold a workpiece even in a processing treatment after exposure to a high-temperature environment and an ability to shear-peel the workpiece by melting or the like with a heating treatment, a semiconductor device manufacturing process and a semiconductor device, and a temporary fixing composition for shear peeling can be provided.

DETAILED DESCRIPTION OF THE PREFERRED EMBODIMENTS

Hereinbelow, there will be described a stack formed in the workpiece treating method of the present disclosure along with a temporary fixing composition for shear peeling, a workpiece treating method, and a semiconductor device and a process for manufacturing the same.

Each component exemplified herein, for example, each component in the composition may be used singly, or two or more may be used in combination.

The term temporary fixing material in the disclosure means a material used to hold a workpiece on a support so that the workpiece will not be displaced and will not move off the support during processing and/or transporting of the workpiece. The term workpiece means an object that will be processed or transported in the step (2) described later (for example, an object at the stage of the step (1) or (2) described later), or sometimes means an object that has been processed or transported (for example, an object at the stage of the step (3) described later). Hereinafter, the workpiece will be also written as "workpiece for processing".

[Stack]

A stack formed in the present invention includes a support, a temporary fixing material, and a workpiece for processing, wherein the workpiece for processing is held on the temporary fixing material. For example, a workpiece for processing, to be processed or transported, is temporarily held on a support through a temporary fixing material. Specifically, the stack preferably has a support, a temporary fixing material, and a workpiece for processing in the stacking direction in the order named.

<Polymer (A) Layer>

The temporary fixing material includes a layer containing a polymer (A) in a range of not less than 50 mass %, the polymer (A) including a structural unit represented by the following formula (A1). Hereinafter, the layer is also written as "polymer (A) layer".

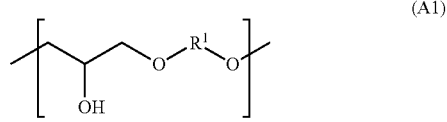

(A1)

In the formula (A1), $R^1$ is a divalent organic group including at least one aromatic ring, each of two oxygen atoms bonded to $R^1$ in the formula (A1) is bonded to the aromatic ring, and, when $R^1$ includes two or more aromatic rings, each of the two oxygen atoms is bonded to any one of the aromatic rings. For example, when $R^1$ has one aromatic ring, each of the two oxygen atoms is bonded to the same aromatic ring in $R^1$. When $R^1$ has two or more aromatic rings, each of the two oxygen atoms may be bonded to the same aromatic ring in $R^1$, or may be bonded to a different aromatic ring in $R^1$.

Examples of the divalent organic groups include divalent groups derived from bisphenol, divalent groups derived from catechol, and divalent groups derived from biphenol, in which two oxygen atoms bonded to $R^1$ in the formula (A1) correspond to oxygen atoms in the phenolic hydroxyl groups of each of bisphenol, catechol, and biphenol.

The polymer (A) is a so-called phenoxy resin. The polymer (A) not only is excellent in heat resistance, but also has a large number of hydroxyl groups, and therefore is hardly decomposed or altered even if exposed to a high-temperature environment (for example, 200 to 300° C.). Accordingly, the polymer (A) layer can withstand a shear force and maintain adhesion or holding power to the support and the workpiece even in a processing treatment at around ordinary temperature after exposure to high temperatures. The polymer (A) layer can be molten or softened by a corresponding heating treatment, thereby allowing the workpiece to be easily separated from the support by a shearing treatment.

$R^1$ is a divalent organic group represented by the following formula (a).

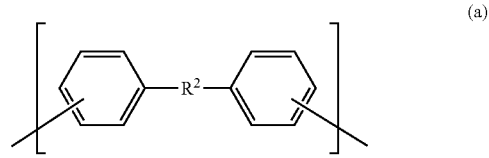

(a)

In the formula (a), $R^2$ is a single bond or an alkanediyl group, and each of two benzene rings may independently have a substituent. Two or more substituents may be present, and in this case, these substituents may be the same as or different from one another.

Examples of substituents that may be included in the benzene rings in the formula (a) include halogen atoms, specifically, fluorine, chlorine, and bromine; hydrocarbon groups, specifically, alkyl groups with 1 to 20 carbon atoms, such as methyl group, ethyl group, and propyl group, cycloalkyl groups with 3 to 20 carbon atoms, such as cyclopentyl group and cyclohexyl group, and aryl groups with 6 to 18 carbon atoms, such as phenyl group, naphthyl group, and anthracenyl group.

Examples of the alkanediyl group in $R^2$ include methane-1,1-diyl group, ethane-1,1-diyl group, ethane-1,2-diyl group, propane-1,1-diyl group, propane-1,2-diyl group, propane-1,3-diyl group, propane-2,2-diyl group, butane-1,2-diyl group, butane-1,3-diyl group, butane-1,4-diyl group, pentane-1,4-diyl group, butane-2,2-diyl group, pentane-1,5-diyl group, hexane-1,5-diyl group, hexane-1,6-diyl group, heptane-1,7-diyl group, and octane-1,8-diyl group. The number of carbon atoms in the alkanediyl group is preferably 1 to 8, more preferably 2 to 6.

Some of hydroxyl groups in the formula (A1) in the entire polymer (A) may be subjected to, for example, alkyl esterification or alkyl etherification.

The hydroxyl value of the polymer (A) is preferably 100 to 240 mgKOH/g, more preferably 130 to 220 mgKOH/g, still more preferably 160 to 210 mgKOH/g. Such a mode is preferable so that a temporary fixing material that can simultaneously have an ability to temporarily hold a workpiece even in a processing treatment after exposure to a high-temperature environment and an ability to shear-peel the workpiece by melting or the like through a heating treatment is obtained. The hydroxyl value can be measured according to JIS K0070:1992.

Specific examples of the polymer (A) include bisphenol type phenoxy resins such as bisphenol A type phenoxy resin, bisphenol B type phenoxy resin, bisphenol E type phenoxy resin, and bisphenol F type phenoxy resin; phenoxy resins having two or more bisphenol backbones, such as copolymer of bisphenol A type epoxy resin and bisphenol F type epoxy resin; and biphenyl type phenoxy resins.

The proportion of the content of the structural unit represented by the formula (A1) is usually not less than 80 mass %, preferably not less than 90 mass %, more preferably not less than 99 mass % of the polymer (A) taken as 100 mass %. Such a mode tends to allow the polymer (A) layer to be obtained with excellent heat resistance and adhesion. The proportion of the content can be measured by $^1$H NMR.

The polymer (A) is, for example, a phenoxy resin synthesized from a phenol compound having two phenolic hydroxyl groups, such as bisphenol, biphenol, and catechol, and epihalohydrin such as epichlorohydrin, and has a higher molecular weight than conventional epoxy resins.

The weight average molecular weight (Mw) of the polymer (A) measured by gel permeation chromatography (GPC) relative to polystyrenes is usually not less than 5,000, preferably 10,000 to 500,000, more preferably 15,000 to 100,000. Such a mode can allow the polymer (A) layer to be formed with excellent heat resistance. The details of the Mw measuring method will be described later in Examples.

When the temporary fixing material remains on the workpiece separated from the support, the remaining temporary fixing material is needed to be removed by a solvent. In order to form the polymer (A) layer excellent in not only heat resistance, but also washability, the Mw of the polymer (A) measured by GPC relative to polystyrenes is preferably not more than 70,000, more preferably not more than 60,000, still more preferably not more than 55,000. Herein, a case where the remaining temporary fixing material can be easily removed by a solvent or the like is defined as being excellent in washability.

The proportion of the content of the polymer (A) included in the polymer (A) layer is not less than 50 mass %, preferably not less than 60 mass %, still more preferably not less than 70 mass %.

In an embodiment, the polymer (A) layer is formed from a temporary fixing composition containing the polymer (A) and a solvent. The proportion of the content of the polymer (A) included in the temporary fixing composition is not less than 50 mass %, preferably not less than 60 mass %, still more preferably not less than 70 mass % of the solid content of the temporary fixing composition taken as 100 mass %. The solid content means the content of all components except the solvent. Such a mode is advantageous in terms of the heat resistance of the temporary fixing material and the separability of the workpiece from the support.

The temporary fixing composition containing the polymer (A) and the solvent, in which the proportion of the content of the polymer (A) in the solid content is not less than 50 mass %, is useful as a temporary fixing composition for shear peeling. The temporary fixing composition for shear peeling means specifically a composition for forming a temporary fixing material that can conduct the sheer peeling as described above by application of a shear force under an appropriate temperature condition.

In the present disclosure, the polymer (A) can be used to thereby allow heat resistance and shear force resistance to be simultaneously satisfied. Therefore, the amount of a tackifier low in heat resistance, such as petroleum resin and rosin or liquid rubber, to be used, can be reduced, and thus deterioration in adhesion due to decomposition or alteration of the tackifier can be prevented. For example, the proportion of the content of the tackifier in the temporary fixing composition can be less than 10 mass %, preferably less than 1 mass % of the solid content taken as 100 mass %.

Where necessary, the temporary fixing composition may contain at least one selected from antioxidants, polymerization inhibitors, adhesion improvers, surfactants, crosslinked polystyrene particles, crosslinking agents, and particles of metal oxides.

The temporary fixing composition may be prepared by mixing the components using a known device as required which is used for the processing of resin compositions, for example, a twin-screw extruder, a single-screw extruder, a continuous kneader, a roll kneader, a pressure kneader or a Banbury mixer. To remove foreign matter, filtration may be performed appropriately.

The temporary fixing composition contains a solvent. Any solvent may be used in the production of the temporary fixing composition in order to adjust the viscosity to a level suited for application. Examples of such solvents include hydrocarbon solvents such as pentane, hexane, decane, limonene, mesitylene, dipentene, pinene, bicyclohexyl, cyclododecene, 1-tert-butyl-3,5-dimethylbenzene, butylcyclohexane, cyclooctane, cycloheptane, cyclohexane, and methylcyclohexane; alcohol or ether solvents such as anisole, propylene glycol monomethyl ether, dipropylene glycol methyl ether, diethylene glycol monoethyl ether, and diglyme; ester or lactone solvents such as ethylene carbonate, ethyl acetate, N-butyl acetate, ethyl lactate, ethyl 3-ethoxypropionate, propylene glycol monomethyl ether acetate, diethylene glycol monoethyl ether acetate, propylene carbonate, and γ-butyrolactone; ketone solvents such as cyclopentanone, cyclohexanone, methyl isobutyl ketone, and 2-heptanone; and amide or lactam solvents such as N-methyl-2-pyrrolidone.

The use of the solvent facilitates controlling the viscosity of the temporary fixing composition, and thus facilitates the formation of the temporary fixing material on the workpiece or the support. For example, the solvent may be usually used in such an amount that the solid concentration of the temporary fixing composition is usually in the range of 5 to 70 mass %, preferably 5 to 50 mass %. Here, the "solid concentration" is the total concentration of all the components except the solvent.

The temporary fixing composition described above is useful as a temporary fixing composition for shear peeling, as described above.

<Additional Layer>

In addition to the polymer (A) layer, the temporary fixing material may have an adhesive layer disposed on the polymer (A) layer in direct contact or via another layer. The adhesive layer may be formed from a known adhesive for temporarily fixing a workpiece, for example, a thermoplastic resin-based, elastomer-based, or thermosetting resin-based adhesive (namely, another temporary fixing composition except the temporary fixing composition containing the polymer (A) in the range of not less than 50 mass % in the solid content), and a mixture of two or more selected from the above adhesives may be used.

The temporary fixing material may optionally have an additional layer other than the polymer (A) layer and the adhesive layer. In the case where the stack has the support, the adhesive layer, the polymer (A) layer and the workpiece in this order, for example, an intermediate layer may be provided between the polymer (A) layer and the adhesive layer, and an additional layer may be provided between the adhesive layer and the support, or between the polymer (A) layer and the workpiece.

The polymer (A) layer is preferably a layer in contact with the workpiece in the stack.

The total thickness of the temporary fixing material is usually 0.01 to 1000 µm, preferably 0.1 to 500 µm, more preferably 0.2 to 300 µm. The respective thicknesses of the polymer (A) layer and the adhesive layer are usually not less than 0.01 µm, preferably not less than 0.1 µm, more preferably not less than 0.2 µm. Such a mode allows the temporary fixing material to exhibit a sufficient holding power for fixation of the workpiece, and allows the workpiece not to be detached from the temporary fixation face during processing or transporting.

[Workpiece Treating Method]

The workpiece treating method of the present disclosure includes a step (1) of forming the stack, in which the workpiece is held on the temporary fixing material, a step (2) of processing the workpiece, and/or transporting the stack, and a step (3) of separating the workpiece from the support by application of a shear force to the temporary fixing material.

<Step (1)>

In the step (1), a workpiece is temporarily fixed on a support by, for example, forming the temporary fixing material described hereinabove on a surface of the support and/or the workpiece and joining the workpiece and the support together via the temporary fixing material. Alternatively, a workpiece may be temporarily fixed on a support by forming the temporary fixing material described hereinabove on a surface of the support and forming a workpiece such as a resin film or a wiring layer on the temporary fixing material. The workpiece may be surface treated as required.

For example, the temporary fixing material may be formed by a method where the temporary fixing material is directly formed on the support and/or the workpiece, or a method where the temporary fixing composition or the adhesive is applied in a uniform thickness onto a release-treated film, and the temporary fixing material is then transferred onto the support and/or the workpiece by lamination. The directly forming method is preferable from the point of view of the uniformity in film thickness.

When the temporary fixing material is formed on a workpiece, a surface of the workpiece (for example, a circuit face) may be surface treated beforehand to allow the temporary fixing material to spread on the plane uniformly. An example method of surface treatment is to apply a surface treating agent to the surface of the workpiece beforehand. Examples of the surface treating agents include coupling agents such as silane coupling agents, and organic solvents.

Hereinafter, the method for forming the polymer (A) layer will be described. Some example methods for applying the temporary fixing composition include spin coating methods and inkjet methods. After the temporary fixing composition is applied to form a film, the solvent is evaporated by, for example heating as required, and thereby the polymer (A) layer is formed. The heating conditions are determined appropriately in accordance with the boiling point of the solvent. For example, the heating temperature is usually 100 to 300° C., and the heating time is usually 1 to 60 minutes.

For example, the pressure bonding of the workpiece with the support via the temporary fixing material may be preferably performed by applying a pressure of 0.01 to 100 MPa in the direction of the staking of the layers at 100 to 300° C., more preferably 150 to 280° C., for 10 seconds to 20 minutes. In the manner described hereinabove, the workpiece is strongly secured on the support through the temporary fixing material.

Examples of the workpieces for processing that are to be processed (transported) include semiconductor wafers, semiconductor chips, glass substrates, resin substrates, metal substrates, metal foils, polishing pads, resin films and wiring layers. At least one selected from bumps, wires, through-holes, through-hole vias, insulating films and various elements may be disposed in the semiconductor wafers and semiconductor chips. Various elements may be disposed in or mounted on the substrates. Examples of the resin films include layers containing organic components as the predominant components; with specific examples including photosensitive resin layers formed from photosensitive materials, insulating resin layers formed from insulating materials, and photosensitive insulating resin layers formed from photosensitive insulating resin materials.

Examples of the supports include silicon wafers, glass substrates, quartz substrates and transparent resin substrates.

Hereinbelow, workpieces for processing having at least a wiring layer will be described. In this process, a temporary fixing material is formed on a support, a workpiece for processing, having at least a wiring layer, is formed on the temporary fixing material before and independently from a device, for example, a semiconductor wafer or chip, and, in the step (2) described later, a semiconductor wafer having a plurality of semiconductor elements on a wafer substrate, or a semiconductor chip is arranged on the wiring layer. The wiring layer is electrically connected to the semiconductor wafer or chip to serve as a redistribution layer for the semiconductor wafer or chip. The present disclosure can be applied to such an RDL (Redistribution Layer)-First structure in the FO-WLP (Fan-Out Wafer Level Package) technology.

The wiring layer has, for example, an insulating section, a wiring section, and a conductive connection section to be connected to an electrode of a semiconductor wafer or chip. A semiconductor wafer or chip is arranged on the wiring layer, and the conductive connection section of the wiring layer is electrically connected to an electrode of the semiconductor wafer or chip via a joint member such as a solder, an anisotropic conductive paste or an anisotropic conductive film. If a gap is present between the semiconductor wafer or chip and the wiring layer, an underfill material may be used to fill the gap.

The inside structure of the wiring layer is not particularly limited. Examples of the materials of the wiring sections and the conductive connection sections include metals such as copper, gold, silver, platinum, lead, tin, nickel, cobalt, indium, rhodium, chromium, tungsten and ruthenium, and alloys of two or more kinds of these metals. Examples of the materials of the insulating sections include known synthetic resins such as polyimide resins, acrylic resins, polyetherni-trile resins, polyethersulfone resins, epoxy resins, polyethylene terephthalate resins, polyethylene naphthalate resins and polyvinyl chloride resins. The thickness of the wiring layer is usually 1 to 1,000 μm.

After the above process, the semiconductor wafer or chip is, for example, sealed with a resin in the step (2), and the temporary fixing material and the wiring layer are separated from each other in the step (3). A semiconductor device having the semiconductor wafer or chip and the wiring layer (a redistribution layer) can be thus obtained.

<Step (2)>

In the step (2), the workpiece temporarily fixed on the support is processed and/or the stack is transported. The transportation step is a step of transporting the workpiece such as a semiconductor wafer from one apparatus to another together with the support. Examples of the processing treatments performed on the workpiece temporarily fixed on the support include dicing of the workpiece, thinning of the workpiece (such as back-grinding), photofabrication, stacking of a semiconductor wafer or chip by a plating reflow treatment, mounting of various elements, and sealing with resins. For example, the photofabrication includes one or more treatments selected from resist pattern formation, etching, sputtered film formation, and plating treatment. For example, the etching and the sputtered film formation take place in a range of temperatures of about 25 to 300° C. For example, the plating treatment and the plating reflow treatment are performed in the range of temperatures of about 225 to 300° C. The temperature at which the workpiece is processed is not particularly limited as long as the temporary fixing material does not lose its holding power.

In, for example, the RDL-First structure described above, a workpiece for processing, having at least a wiring layer, is formed on the temporary fixing material in the step (1). In the step (2), at least one selected from semiconductor wafers and semiconductor chips is arranged on the wiring layer, and the wiring layer is electrically connected to the semiconductor wafer or chip. Where necessary, the semiconductor wafer or chip is subsequently sealed with a resin.

A shear force is loaded to the temporary fixing material at around ordinary temperature in thinning of the workpiece such as back-grinding. In the present disclosure, for example, even when a processing treatment where a shear force is loaded to the temporary fixing material is performed at around ordinary temperature such as temperatures of 10 to 50° C. after a processing treatment under a high-temperature environment of 200 to 300° C., the temporary fixing material can withstand the shear force, and can hold the workpiece.

<Step (3)>

After the workpiece is processed or the stack is transported, a shear force is applied to the temporary fixing material, thereby separating the workpiece from the support, in the step (3).

The adhesion of the temporary fixing material is preferably reduced by heating the temporary fixing material, thereby melting or softening it before and/or during the application of a shear force. The heating temperature here is usually not less than 100° C., preferably 120 to 280° C., more preferably 150 to 250° C.

The shear force to the temporary fixing material is applied by, for example, performing a shearing treatment for allowing the force to act on the workpiece or the support in a direction approximately parallel to a temporary fixation surface between the support and the workpiece (a surface of the support or a surface of the workpiece). Specifically, the workpiece is slid in a direction parallel to the temporary fixation surface, thereby allowing the workpiece to be separated from the support. The shear force here is usually 0.001 to 10 MPa, preferably 0.1 to 1 MPa.

To prevent the workpiece from damage during the separation, a reinforcing tape, for example, a commercial dicing tape may be attached to the surface of the workpiece that is opposite to the surface temporarily fixed on the support.

When the temporary fixing material remains on the workpiece separated from the support, the remaining temporary fixing material can be removed by, for example, washing with a washing liquid made of a solvent that can be used in preparation of the temporary fixing composition. For example, the washing may be performed by a method in which the workpiece is soaked in a washing liquid, and a method in which a washing liquid is sprayed to the workpiece, and the workpiece may be ultrasonicated during the soaking. The temperature of the washing liquid is not particularly limited, but is preferably 10 to 80° C., more preferably 15 to 55° C.

The support and the workpiece can be easily separated from each other in the manner described hereinabove. After separation, the workpiece may be subjected to a further processing treatment. For example, an RDL-First structure may be subjected to treatments such as the formation of bumps on the wiring layer, and dicing into individual packages.

[Semiconductor Device and Process for Manufacturing the Same]

A semiconductor device of the present disclosure may be manufactured by processing a workpiece by the workpiece treating method of the disclosure. Since the temporary fixing material can be removed in separation of a semiconductor device (for example, a semiconductor element) obtained by processing a workpiece, from a support, the semiconductor device of the disclosure scarcely contaminated, for example, scarcely stained or scorched by the temporary fixing material.

EXAMPLES

Hereinbelow, the present disclosure will be described in further detail based on Examples. However, it should be construed that the scope of the present disclosure is not limited to such Examples. In Examples and the discussions hereinbelow, "parts" represent "parts by mass" unless otherwise mentioned.

The weight average molecular weights (Mw) of polymers were measured on "HLC-8220-GPC" instrument (manufactured by TOSOH CORPORATION) equipped with GPC columns (two G2000HXL columns, one G3000HXL column, and one G4000HXL column) manufactured by TOSOH CORPORATION, using polystyrene standards.

1. Production of Temporary Fixing Composition

Examples 1 to 3 and Comparative Examples 1 to 2

Production of Temporary Fixing Compositions (I-1) to (I-5)

The components described in Table 1 were mixed together in the amounts shown in Table 1 to give temporary fixing compositions (I-1) to (I-5). The details of the components in Table 1 are described below.

TABLE 1

|  | Ex. 1 | Comp. Ex. 1 | Comp. Ex. 2 | Ex. 2 | Ex. 3 |
|---|---|---|---|---|---|
| Temporary fixing composition | I-1 | I-2 | I-3 | I-4 | I-5 |
| Heat resistant polymer (A1) | 100 parts | | | | |
| Heat resistant polymer (A2) | | | | 100 parts | |
| Heat resistant polymer (A3) | | | | | 100 parts |
| Heat resistant polymer (RA1) | | 100 parts | 90 parts | | |
| Tackifier (B1) | | | 10 parts | | |
| Solvent (C1) | 200 parts | | | 200 parts | 200 parts |
| Solvent (C2) | | 200 parts | 200 parts | | |

Heat resistant polymer (A1): phenoxy resin (weight average molecular weight: 30,000, hydroxyl value: 197 mgKOH/g)

Heat resistant polymer (A2): phenoxy resin (weight average molecular weight: 50,000, hydroxyl value: 196 mgKOH/g)

Heat resistant polymer (A3): phenoxy resin (weight average molecular weight: 80,000, hydroxyl value: 195 mgKOH/g)

Heat resistant polymer (RA1): cycloolefin polymer
(trade name "ARTON RX4500" manufactured by JSR CORPORATION)

Tackifier (B1): liquid styrene-butadiene rubber
(trade name "Kuraprene L-SBR-820" manufactured by KURARAY CO., LTD.)

Solvent (C1): cyclohexanone

Solvent (C2): mesitylene

2. Evaluation

Example 1A

The temporary fixing composition (I-1) was applied onto a 4-inch silicon wafer (workpiece) according to a spin coating method, and heated on a hot plate at 180° C. for 2 minutes in the air and thereafter heated at 200° C. for 3 minutes under a nitrogen atmosphere to give a substrate having a temporary fixing material layer with a thickness of 30 μm. The thickness of the temporary fixing material layer was measured with a contact-type thickness meter. The substrate obtained was cut to a square with a length of 1 cm and a width of 1 cm, to give a substrate 1 having a temporary fixing material layer.

The substrate 1 and a glass substrate (a glass substrate having a square face of 2 cm×2 cm; support) were joined together via the temporary fixing material layer. With use of a die bonder, a pressure of 0.2 MPa was applied thereto at 180° C. for 60 seconds, and a stack (I-1) was produced in which the silicon wafer and the glass substrate were temporarily fixed via the temporary fixing material layer. It could be visually confirmed that the temporary fixation was made with no air bubbles between the glass substrate and the temporary fixing material layer.

After the stack (I-1) was heated at 250° C. for 2 hours, a universal bond tester (trade name "DAGE 4000" manufactured by DAGE) was used to apply a shear force of 2 MPa (stage temperature: 23° C.) in a direction parallel to the plane of the workpiece of the stack (I-1), and it could be confirmed that the silicon wafer and the glass substrate were not detached from each other and were held (temporarily fixed).

Next, a universal bond tester (trade name "DAGE 4000" manufactured by DAGE) was used to apply a shear force (speed: 500 μm/sec, stage temperature: 250° C.) in a direction parallel to the plane of the workpiece of the stack (I-1). As a result, the glass substrate could be shear-peeled by a force of less than 0.2 MPa.

Next, the residue of the temporary fixing material of the workpiece shear-peeled was washed. The workpiece shear-peeled was soaked at 23° C. in the same solvent as that included in the temporary fixing composition. The time until the residue of the temporary fixing material disappeared was measured as the washability, and it was found to be 15 minutes.

Examples 2A to 3A and Comparative Examples 1A to 2A

The temporary fixing compositions in Table 2 were used to give stack (I-2) to stack (I-5) in the same manner as in Example 1A, and the holding property, shear peelability, and washability of each of stack (I-2) to stack (I-5) heated at 250° C. for 2 hours were evaluated. The evaluation results are described in Table 2.

Example 4A

The temporary fixing composition (I-1) was applied onto a 4-inch silicon wafer (workpiece) according to a spin coating method, and heated on a hot plate at 80° C. for 3 minutes and then at 150° C. for 3 minutes in the air, and thereafter heated at 200° C. for 6 minutes under a nitrogen atmosphere to give a substrate having a temporary fixing material layer with a thickness of 50 μm. The thickness of the temporary fixing material layer was measured with a contact-type thickness meter. The substrate obtained was cut to a square with a length of 1 cm and a width of 1 cm, to give a substrate 2 having a temporary fixing material layer.

Thereafter, a stack (I-6) was produced in the same manner except that substrate 2 was used instead of substrate 1 in Example 1A, and the holding property, shear peelability, and washability of the stack (I-6) heated at 250° C. for 2 hours were evaluated. The evaluation results are described in Table 2.

TABLE 2

| | Ex. 1A | Comp. Ex. 1A | Comp. Ex. 2A | Ex. 2A | Ex. 3A | Ex. 4A |
|---|---|---|---|---|---|---|
| Temporary fixing composition | I-1 | I-2 | I-3 | I-4 | I-5 | I-1 |
| Holding property (whether or not silicon wafer and glass substrate were detached by application of shear force (23° C.)) | Not detached (holding property) | Detached (no holding property) | Detached (no holding property) | Not detached (holding property) | Not detached (holding property) | Not detached (holding property) |
| Shear peelability (whether or not silicon wafer and glass substrate were detached by application of shear force (250° C.)) | Detached (shear peelability) | Detached (shear peelability) | Detached (shear peelability) | Detached (shear peelability) | Detached (shear peelability) | Detached (shear peelability) |
| Washability (time until residue of temporary fixing material disappeared) | 15 minutes | 15 minutes | 15 minutes | 15 minutes | 25 minutes | 20 minutes |

No holding property was exhibited in Comparative Examples 1A and 2A. The reason was considered because the adhesion was insufficiently exhibited only by the cycloolefin polymer (Comparative Example 1A), and the adhesion was deteriorated by decomposition, alteration or the like of the tackifier after exposure to a high-temperature environment, when the tackifier was used together with the cycloolefin polymer (Comparative Example 2A). On the contrary, both holding property and shear peelability were exhibited in Examples.

What is claimed is:

1. A workpiece treating method comprising:
   a step (1) of forming a stack including a support, a temporary fixing material and a workpiece, wherein the temporary fixing material includes a layer containing a polymer (A) in a range of not less than 50 mass %, the polymer (A) including a structural unit represented by the following formula (A1), and the workpiece is held on the temporary fixing material;
   a step (2) of processing the workpiece and/or transporting the stack; and
   a step (3) of applying a shear force to the temporary fixing material to thereby separate the workpiece from the support,

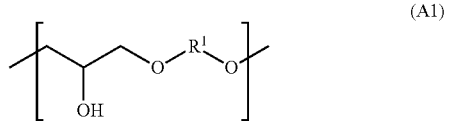

(A1)

wherein in the formula (A1), $R^1$ is a divalent organic group including at least one aromatic ring, each of two oxygen atoms bonded to $R^1$ in the formula (A1) is bonded to the aromatic ring, and, when $R^1$ includes two or more aromatic rings, each of the two oxygen atoms is bonded to any one of the aromatic rings.

2. The workpiece treating method according to claim 1, wherein $R^1$ in the formula (A1) is a divalent organic group represented by the following formula (a),

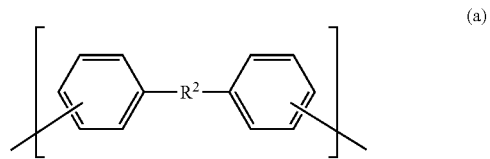

(a)

wherein in the formula (a), $R^2$ is a single bond or an alkanediyl group, and each of two benzene rings may independently have a substituent.

3. The workpiece treating method according to claim 1, wherein the polymer (A) has a hydroxyl value of 100 to 240 mgKOH/g.

4. The workpiece treating method according to claim 1, wherein the polymer (A) has a weight average molecular weight of 5,000 to 70,000.

5. The workpiece treating method according to claim 1, wherein the step (1) comprises forming a workpiece having at least a wiring layer, on the temporary fixing material.

6. The workpiece treating method according to claim 5, wherein the processing in the step (2) comprises arranging at least one selected from semiconductor wafers and semiconductor chips onto the wiring layer.

7. The workpiece treating method according to claim 1, wherein the temporary fixing material is heated before and/or during applying the shear force in the step (3).

8. A semiconductor device manufacturing process comprising manufacturing a semiconductor device by processing a workpiece using the treating method described in claim 1.

* * * * *